United States Patent
Furukawa

[11] Patent Number: 5,822,641
[45] Date of Patent: Oct. 13, 1998

[54] HEATING APPARATUS AND THERMAL DEVELOPING SYSTEM

[75] Inventor: Koji Furukawa, Shizuoka, Japan

[73] Assignee: Fuji Photo Film Co., Ltd., Kanagawa, Japan

[21] Appl. No.: 805,712

[22] Filed: Feb. 25, 1997

[30]     Foreign Application Priority Data

Feb. 27, 1996   [JP]   Japan ................................... 8-039906
Apr. 16, 1996   [JP]   Japan ................................... 8-094197
Dec. 27, 1996   [JP]   Japan ................................... 8-350840

[51] Int. Cl.$^6$ ................................................ G03D 7/00
[52] U.S. Cl. ........................................ 396/575; 219/216
[58] Field of Search ................................. 396/575, 572; 355/27–28, 405; 219/216

[56]               References Cited

U.S. PATENT DOCUMENTS 4,465,760   8/1984   Leyrer et al. ........................... 430/325
4,565,771   1/1986   Lynch et al. ............................ 430/307

OTHER PUBLICATIONS

Patent Abstracts of Japan vol. 004, No. 055 (P–008), Apr. 24, 1980 & JP 55 025050 A (Toyo Shigyo KK) Feb. 22, 1980
*Abstract.

Patent Abstracts of Japan vol. 017, No. 010 (P–1466) Jan. 8, 1993 & JP 04 240643 A (Konica Corp) Aug. 27, 1992
*Abstract.

*Primary Examiner*—D. Rutledge
*Attorney, Agent, or Firm*—Sughrue, Mion, Zinn, Macpeak & Seas, PLLC

[57]                ABSTRACT

It is an object of the present invention to provide a heating apparatus that eliminates the poor heating due to thermal expansion and thereby assures satisfactory thermal developing performance without unevenness and which, in addition, is capable of processing printing plates wider than 400 mm, as well as a thermal developing system equipped with said heating apparatus. The heating apparatus 1 having a pressure contact zone P, in which the length lo of the pressure contact zone P in the direction of travel is set by calculation from the relation (1): $lo = dl/(\alpha \cdot dT)$, where lo is the length of the pressure contact area in the direction of travel, dT is an incremental temperature elevation, $\alpha$ is the coefficient of thermal expansion of the metal support of an original printing plate, and dl is the thermal expansion in millimeters of the metal support in the pressure contact zone P in the direction of travel, such that dl satisfies $dl < 0.13/D$, where D is the thickness in millimeters of the metal support.

5 Claims, 9 Drawing Sheets

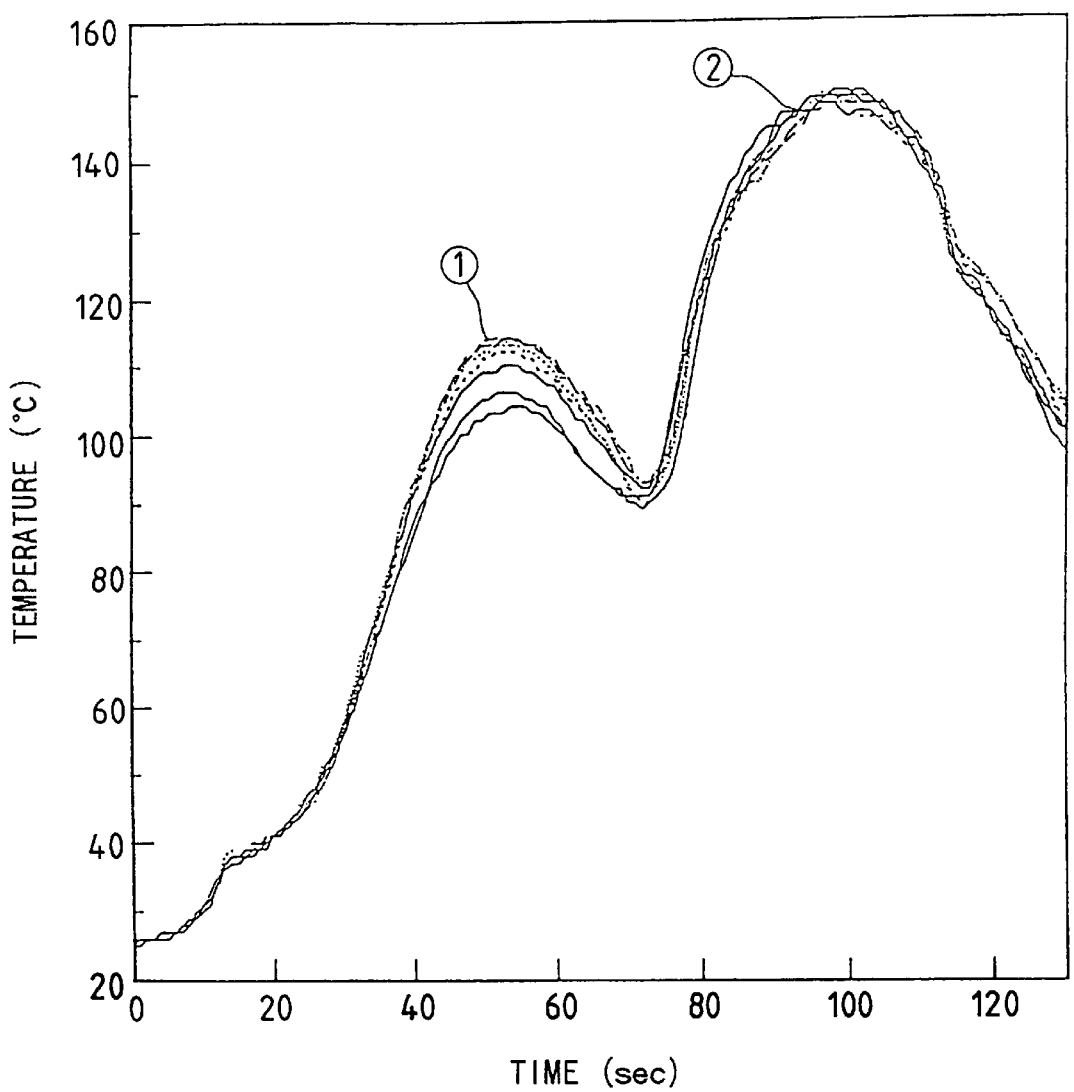

HEATING APPARATUS AND THERMAL DEVELOPING SYSTEM

BACKGROUND OF THE INVENTION

The present invention relates to a heat treatment apparatus for heating an exposed light-sensitive lithographic original printing plate during transport, particularly to an apparatus applicable as a component of a system for thermal development of printing plates.

Methods comprising the steps of exposing imagewise a light-sensitive material containing a silver halide, a reducing agent and a polymerizable compound and developing the sliver halide to thereby polymerize the polymerizable compound imagewise so as to form a polymer image are described in Examined Japanese Patent Publications Hei 3-12307 and Hei 3-12308 (corresponding to U.S. Pat. No. 4,629,676 and EP 0174634). In these methods, polymerization is initiated by radicals in the oxidized form of the reducing agent with which the sliver halide has been reduced (the radicals may be those generated by the decomposition of the oxidized form of the reducing agent and are hereunder referred to simply as oxidized form radicals). Stated more specifically, thermal development is implemented such that the light-sensitive material is heated to develop the silver halide, thereby forming a hardened image of the polymerizable compound.

These methods of image formation are also applicable to the manufacture of printing plates.

Light-sensitive materials suitable for use in the manufacture of printing plates are described in Unexamined Published Japanese Patent Application Sho 64-17047 (corresponding to U.S. Pat. No. 4,985,339 and EP 0298522), Unexamined Published Japanese Patent Application Hei 5-249667 (corresponding to U.S. Pat. No. 5,122,443 and EP 0426192), as well as Unexamined Published Japanese Patent Application Hei 4-191856 (corresponding to U.S. Pat. No. 5,290,659), Unexamined Published Japanese Patent Applications Hei 5-142775, Hei 6-27652 and Hei 5-107764. The light-sensitive materials described in these patents are characterized by utilizing a curing reaction in which the silver halide serves as an optical sensor; at least three layers, i.e., a hardenable layer containing a polymerizable compound or a crosslinkable polymer, a light-sensitive layer containing the silver halide and an overcoating layer containing a base precursor, are superposed in that order, with a reducing agent being incorporated in either one of these layers (this light-sensitive material will hereunder be referred to as a light-sensitive material of a silver triggered polymerization type). In the manufacture of printing plates, the polymerizable compound of the crosslinkable polymer is hardened by the above-described thermal development and the unhardened areas are removed with a dissolving solution, with the remaining hardened image being utilized as the image on the printing plate.

Most printing plates use metal plates (typically aluminum plates) as the support.

As will be understood from the above description, a heat treatment apparatus is necessary to form an image on an original printing plate having the light-sensitive material of a silver triggered polymerization type provided on a metal support.

Heat treatments to be performed with such apparatus are roughly divided into two schemes, non-contact heating in which the original printing plate is illuminated with heat rays from a heater as described in Unexamined Published Japanese Patent Application Hei 4-240643, and contact heating in which the original printing plate is placed in contact with the heater. However, the non-contact heating scheme involves several defects such as slowness of the speed at which the original printing plate can be processed and an uneven temperature profile due to the effect of the environmental temperature; hence, the contact heating scheme is generally considered to be advantageous.

In addition, original printing plates in which the image forming layer is made of the light-sensitive material of a silver triggered polymerization type required high heating precision in the thermal development processing; however, the non-contact heating scheme is not capable of meeting this requirement for high-precision heating.

An example of the heating apparatus that operates on the contact heating scheme is shown in FIG. 10; an original printing plate 114 is covered with an endless belt 138 such that it is held between the belt and a heating plate 130; as the endless belt 138 moves, the original printing plate 114 is transported in sliding contact with the heating plate 130 which applies heat for heating the printing plate. The surface of the heating plate 130 is curved in an arcuate form and the original printing plate 114 is made thin enough to be capable of bending along the curvature; the endless belt 138 in sliding contact with the original printing plate 114 is provided with a tension that urges the latter towards the heating plate 130. Transport roller pairs 122 and 124 are provided upstream and downstream, respectively, of the heating plate 130 in the direction of transport such that the original printing plate 114 is supplied between the heating plate 130 and the endless plate 138 and emerges from between these two elements as indicated by arrows A.

The original printing plate 114 supplied between the heating plate 130 and the endless belt 138 by means of transport roller pairs 122 and 124 is transported by sliding contact with the heating plate 130 as the endless belt 138 moves in the directions of arrows D while the plate 130 applies heat for heating the printing plate 114. Since the endless belt 138 is under the tension provided by the curved portion 130B of the heating plate's surface, the printing plate 114 is urged by the endless belt 138 to make close contact with the heating plate, whereby the printing plate 114 is heated uniformly. The light-sensitive material of a silver triggered polymerization type is typically heated at about 70° to 200° C.

Further referring to the original printing plate 114, the use of a metal plate as the support causes the printing plate to expand thermally upon heating irrespective of whether it is accomplished by the non-contact scheme. Since the thermally expanded printing plate 114 deforms in shape, it contacts the heating plate 130 unevenly, lowering the efficiency of thermal development in the incompletely contacting areas. As a result, hardened images will not be produced in those areas by polymerization or the degree of hardening is insufficient to prevent the decrease in image strength; if the printing plate having these defects is employed, the problem of partial "short run" will occur.

If, for example, tiny dots are to be formed with 200 lines for a dot area of 2%, the efficiency of thermal development in the incompletely contacting areas decreases to cause "short cure", whereby the size of the dots formed becomes smaller than in the completely contacting areas and the uniformity necessary to warrant the use of the printing plate is not attained for various reasons such as partial differences in color.

Since the original printing plate 114 has a finite width, the elongation due to thermal expansion is directed from the lateral or end edges inward and the plate usually deforms in such a way that the central portion forms a ridge along the entire length.

To solve these problems, the present inventors filed Japanese Patent Application Hei 6-286813, in which they proposed a heating apparatus characterized in that the pressure profile across the width of the endless belt 138 for causing pressure contact is adjusted to be higher in an area corresponding to the central portion of the original printing plate 114 than in the other areas.

This heating apparatus has the advantage that even if the central portion of the printing plate 114 forms a ridge, the elongation due to thermal expansion is deliberately directed towards both sides of the plate, whereby the entire surface of the latter will make uniform contact with the heating plate 130; as a result, the above-described problems of short press life and uneven thermal development can be avoided.

The heating apparatus proposed in Japanese Patent Application Hei 6-286813 (NOT PRIOR ART), however, has a problem in that although it proves practicably effective with original printing plates having widths of about 400 mm, the decrease in printing durability and the occurrence of uneven development in the central portion of printing plates are unavoidable if they are wider than 400 mm. In particular, there is a growing demand for large printing plates having widths of more than 800 mm and the use of even larger plates is expected in the future; however, the conventional heating apparatus including the one proposed in Japanese Patent Application Hei 6-286813, supra, are incapable of processing such large plates in a completely satisfactory manner.

SUMMARY OF THE INVENTION

The present invention has been accomplished under these circumstances and has as an object providing a heating apparatus that adopts an areal contact heating system with a view to achieving a higher processing speed. Another object of the invention is to provide a thermal developing system equipped with such an improved heating apparatus. To be more specific, the first object of the invention is to provide a heating apparatus that eliminates the poor heating due to thermal expansion and thereby assures satisfactory thermal developing performance without unevenness and which, in addition, is capable of processing printing plates wider than 400 mm. The second object of the invention is to provide a thermal developing system equipped with such an improved heating apparatus.

The first object of the invention can be attained by a heating apparatus having a pressure contact zone in which an original printing plate comprising an image forming layer provided on a metal support is brought into pressure contact with a plate heater such that the plate is heated under areal contact, wherein the length of said pressure contact zone in the direction of travel is set by calculation from the following relation (1):

$$lo = dl/(\alpha \cdot dT) \tag{1}$$

where
- lo: the length of the pressure contact zone in the direction of travel
- dT: an incremental temperature elevation
- a: the coefficient of thermal expansion of the metal support
- dl: the thermal expansion in millimeters of the metal support in the pressure contact zone in the direction of travel such that dl satisfies dl<0.13/D, where D is the thickness in millimeters of the metal support.

In addition, the first object of the invention can be attained by the above-mentioned heating apparatus, in which said original printing plate is brought into pressure contact with said plate heater by applying pressure by means of belts.

Further, the first object of the invention can be attained by the above-mentioned heating apparatus, further comprising a preliminary heating means for preliminarily heating said support before said support is heated by said plate heater, in which said original printing plate is made of an (IR) infrared radiation light-sensitive material (having a light-sensitive wavelength in the range of 650 nm–700 nm), said preliminary heating means is constituted by a far-infrared heater the heating surface of which has a surface temperature not more than 500° C.

Furthermore, the second object of the invention can be attained by a thermal developing system for processing an original printing plate comprising a metal support having provided thereon at least one layer containing a silver halide, a reducing agent, a polymerizable compound or a crosslinkable polymer, and a base precursor, in which the above-mentioned heating apparatus is provided.

As set forth above, the plate heater in contact with the original printing plate is so adapted that its length in the direction of travel of the printing plate is specified on the basis of the thickness of the metal support; as a result, the elongation of the metal support due to thermal expansion is absorbed in the direction of travel of the original printing plate, thereby allowing the original printing plate to be heat treated under conditions that will not cause any deformation (ridge formation in the central portion) of the plate.

This eliminates the poor contact between the plate heater and the original printing plate to thereby prevent the problems of short press life and uneven development.

BRIEF DESCRIPTION OF THE DRAWINGS

FIG. 8 is a graph showing the variations in temperature that occurred to a support in Test 4;

DETAILED DESCRIPTION OF THE PREFERRED EMBODIMENTS

The present invention will now be described specifically with reference to the illustrated embodiment.

Figure 1:
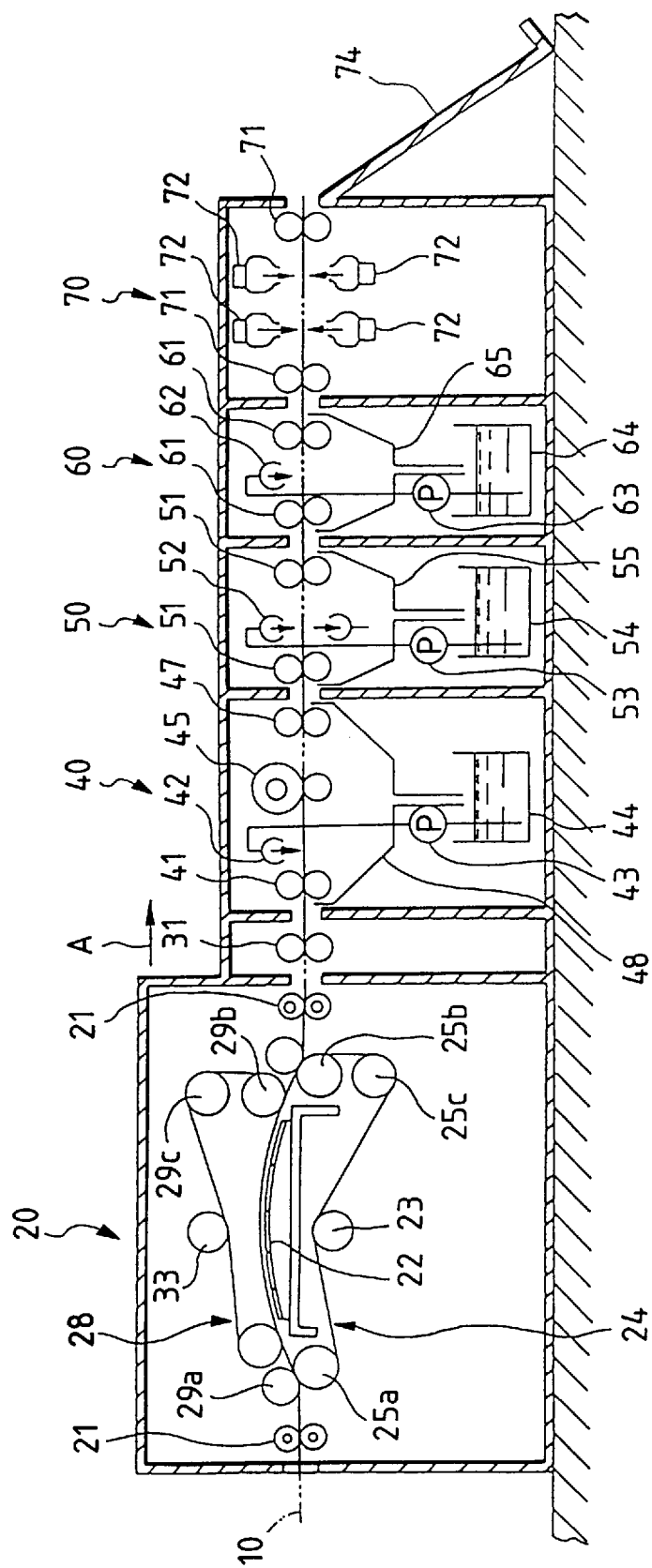
FIG. 1 is a schematic cross section of a thermal developing system employing the heating apparatus of the invention.

FIG. 1 is a schematic cross section of a thermal developing system employing the heating apparatus of the invention.

An original printing plate 10 comprises a support 11 having an image forming layer provided thereon. The support 11 is a thin plate made of a metal, typically aluminum or an aluminum alloy.

The light-sensitive material on the original printing plate 10 which is contemplated by the invention is not limited to any particular type as long as if it can be developed by heating. The light-sensitive materials of a silver triggered polymerization type which are described in Unexamined Published Japanese Patent Application Sho 64-17047, supra (corresponding to U.S. Pat. No. 4,985,339 and EP 0298522), Unexamined Published Japanese Patent Application Hei 5-249667, supra (corresponding to U.S. Pat. No. 5,122,443 and EP 0426192), as well as Unexamined Published Japanese Patent Application Hei 4-191856, supra (corresponding to U.S. Pat. No. 5,290,659), Unexamined Published Japanese Patent Application Hei 5-142775, Hei 6-27652 and Hei 5-107764, supra, can also be used as preferred light-sensitive materials.

The original printing plate 10 in a thermal developing section 20 is guided by transport rollers 21 to be fed between an upper endless belt 28 and a lower endless belt 24. The two endless belts 28 and 24 are rotated in synchronism as they hold the original printing plate 10 between themselves, whereby they transport the plate 10 in a predetermined direction of travel (indicated by arrow A) along a plate heater 22 while, at the same time, the printing plate 10 is heated by means of the heat of plate heater 22 which is conducted through the lower endless belt 24.

The original printing plate 10 is transported from the thermal developing section 20 into a dissolving section 40 past cooling rollers 31 and, as it is transported by means of transport rollers 41, the plate 10 is sprayed with a dissolving solution squirted from a spray nozzle 42; at the same time, the plate 10 is brought into sliding contact with a brush roll 45 and thereafter passed between squeeze rollers 47 such that the excess dissolving solution is removed from the surface of the plate 10.

The transport rollers 41 are provided upstream of the spray nozzle 42 in the direction of transport A and consist of a pair of upper and lower rollers that hold the original printing plate 10 between themselves and as they rotate holding the plate 10 between themselves, the transport rollers 41 transport the plate 10 in the direction of transport A.

The spray nozzle 42 is provided in a face-to-face relationship with the image forming layer which faces up in the embodiment under consideration. A circulating pump 43 pumps up the dissolving solution (e.g. PS plate developing solution DP-4 of Fuji Photo Film Co., Ltd.) form a dissolving tank 44 and the pumped dissolving solution is applied onto the original printing plate 10 via the spray nozzle 42.

The brush roll 45 is provided downstream of the spray nozzle 42 in the direction of travel A and makes a pair with a lower backup roll 46 such that the original printing plate 10 is held between the two rolls. The brush roll 45 is brought into sliding contact with the image forming layer of the sprayed original printing plate 10 such as to accelerate the reaction for dissolving out the non-image areas.

The squeeze rollers 47 are provided downstream of the brush roll 45 in the direction of transport A and consist of a pair of upper and lower rollers that hold the original printing plate 10 between themselves. As they rotate holding the original printing plate 10 between themselves, the squeeze rollers 47 transport the plate 10 in the direction of transport A while, at the same time, they squeeze off the excess dissolving solution from the plate surface. The removed excess dissolving solution is collected by a receiving tray 48, from which it is returned into the dissolving tank 44.

In a rinsing section 50, the original printing plate 10 is transported by means of transport rollers 51 as it is sprayed with rinse water from spray nozzles 52.

The transport rollers 51 are provided both upstream and downstream of the spray nozzles 52 in the direction of travel A and each roller unit consists of a pair of upper and lower rollers that hold the original printing plate 10 between themselves. As they rotate holding the original printing plate 10 between themselves, the transport rollers 51 transport the plate 10 in the direction of transport A. The spray nozzles 52 are provided in a face-to-face relationship with the two sides of the original printing plate 10; a circulating pump 53 pumps up the rinse water from a receiving tank 54 and the pumped rinse water is applied onto both sides of the plate 10 from the spray nozzles 52. The applied rinse water drips from the original printing plate 10 and it is thereafter guided by a receiving tray 55, from which it is returned into the receiving tank 54.

In a liquid gum applying section 60, the original printing plate 10 is transported by means of transport rollers 61 as it is sprayed with a liquid gum from a spray nozzle 62.

The transport rollers 61 are provided both upstream and downstream of the spray nozzle 62 in the direction of travel A and each roller unit consists of a pair of upper and lower rollers that hold the original printing plate 10 between themselves. As they rotate holding the plate 10 between themselves, the transport rollers 61 transport the plate 10 in the direction of transport A. The spray nozzle 62 is provided in a face-to-face relationship with the image forming layer of the original printing plate 10; a circulating pump 63 pumps up the liquid gum (e.g., PS plate gumming solution GU-7 of Fuji Photo Film Co., Ltd.) from a liquid gum tank 64 and the pumped gum is applied onto the image forming layer of the original printing plate 10. The applied liquid gum drips from the plate 10 and it is thereafter guided by a receiving tray 65, from which it is returned into the liquid gum tank 64.

In a drying section 70, the original printing plate 10 is transported by means of transport rollers 71 as it is dried with dryers 72.

The transport rollers 71 are provided both upstream and downstream of the dryers 72 in the direction of travel A and each roller unit consists of a pair of upper and lower rollers that hold the original printing plate 10 between themselves. As they rotate holding the plate 10 between themselves, the transport rollers 71 transport the plate 10 in the direction of travel A. the dryers 72 are provided in two pairs, each consisting of two dryers that are in a face-to-face relationship with the two sides of the original printing plate 10 such that warm air is blown against both sides of the plate 10 to dry it up after it was gummed.

The process of interest goes as follows. In an exposing apparatus (not shown), an original film is placed in contact with the image forming layer of the original printing plate 10 and exposed to a tungsten lamp of 500 watts for a period of 1.5 seconds via a bandpass filter capable of transmitting light at 500 nm, thereby preparing an exposed printing plate. Then, as shown in FIG. 1, the printing plate 10 is fed into the thermal developing section 20, from which it is passed through the dissolving section 40, the rinsing section 50 and the gum applying section 60 to be continuously transported to the drying section 70 such that the plate 10 is subjected to the predetermined treatments successively in the respective sections.

Stated more specifically, the thermally developed printing plate 10 is cooled by means of the cooling rollers 31 and, thereafter, it is subjected to a dissolving treatment in the dissolving section 40 such that the unhardened areas of the image-formation accelerating layer, the light-sensitive layer and the hardenable layer, namely, the non-image areas of the image-forming layer other than the hardened areas of the hardenable layer, are dissolved out. The printing plate 10 is then rinsed in the rinsing section 50 to be freed of the excess dissolving solution; thereafter, the printing plate 10 is gummed in the gum applying section 60 and fed into the drying section 70, where it is dried up by being freed of the liquid gum on the surface. A plurality of printing plates 10 are processed in this manner and stacked on a tray 74.

The heating apparatus of the invention will now be described in detail. The apparatus is the essential part of the thermal developing section of the platemaking system shown in FIG. 1 and is shown enlarged in cross section FIG. 2.

As shown, the heating apparatus generally indicated by 1 comprises as essential elements a plate heater 22, an upper endless belt 28 that is transported by means of a drive roller 29c, and a lower endless belt 24 that is transported by means of a drive roller 25c.

The plate heater 22 has its surface (top surface in FIG. 2) curved in a sectional shape as seen from the lateral side and its surface temperature is always kept at the temperature for the thermal development of the light-sensitive material (e.g. at 150° C.) by means of a common heater.

The lower endless belt 24 is typically made of PTFE (polytetrafluoroethylene) and forms a loop extending from a driven roller 25a provided upstream of and below the plate heater 22 in the direction of travel A, as well as another driven roller 25b and a drive roller 25c that are provided downstream of and below the plate heater 22. When the drive roller 25c is rotated by means of a motor (not shown) or the like, the endless belt 24 will rotate clockwise in the case shown in FIG. 2. The endless belt 24 is stretched by means of a tension roller 23.

Thus, the lower endless belt 24 has its outer peripheral surface 24a kept in contact with the bottom side of the original printing plate 10 as it moves between the driven rollers 25a and 25b and, at the same time, the inner peripheral surface 24b of the belt 24 keeps sliding contact with the surface of the plate heater 22 as it moves between said two driven rollers along the heater's surface in the direction of travel A. It should be noted that the lower endless belt 24 is formed in a width great enough to cover almost all areas of the heating surface of the plate heater 22.

Figure 2:
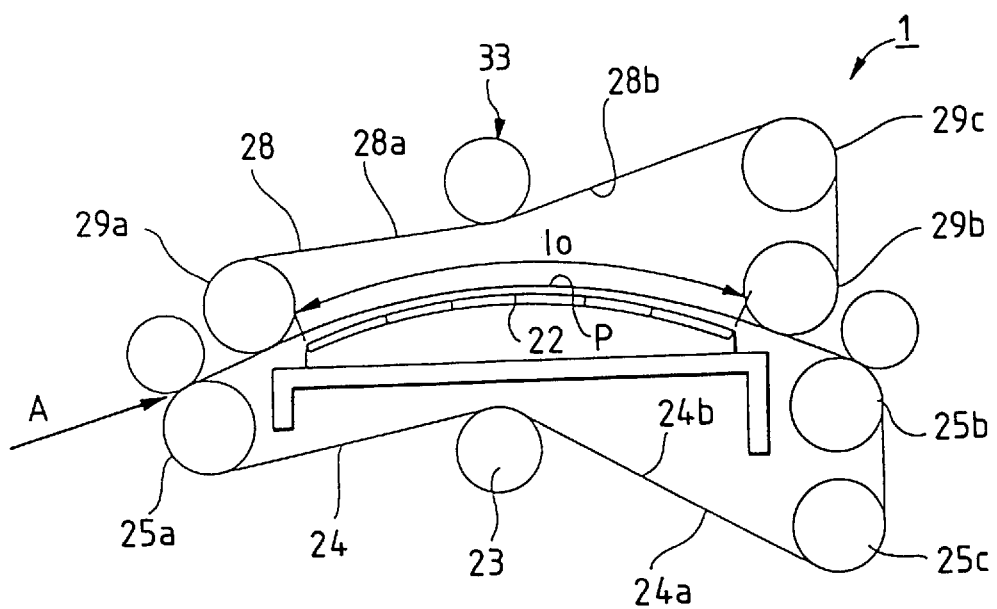
FIG. 2 is a schematic cross section of the heating apparatus of the invention.

The upper endless belt 28 is typically made of PTFE and forms a loop extending from a driven roller 29a provided upstream of and above the plate heater 22 in the direction of travel A, as well as another driven roller 29b and a drive roller 29c that are provided downstream of and above the plate heater 22; when the drive roller 29c is rotated by means of a motor (not shown) or the like, the endless belt 28 will rotate counterclockwise in the case shown in FIG. 2 in synchronism with the lower endless belt 24. The upper endless belt 28 is stretched by means of a tension roller 33 such that it is urged towards the plate heater 22 under a specified pressure.

In addition, the upper endless belt 28 has its outer peripheral surface 28a kept in contact with the top side of the original printing plate 10 as it moves between the driven rollers 29a and 29b and, at the same time, the outer peripheral surface 28a of the belt 28 keeps sliding contact with the surface of the plate heater 22 as it moves between said two driven rollers along the heater's surface in the direction of travel A. It should also be noted that the upper endless belt 28 is formed in a width great enough to cover almost all areas of the heating surface of the plate heater 22.

Thus, the region in which the outer peripheral surface 28a of the upper endless belt 28 contacts the plate heater 22 provides a pressure contact zone P in the present invention and the length of this zone in the direction of travel A (designated by lo in FIG. 2) is substantially equal to the distance between the driven rollers 29a and 29b above the plate heater 22.

The heating apparatus 1 of the invention is characterized in that the length lo of the pressure contact zone P in the direction of travel A is specified to satisfy a certain requirement on the basis of the following observations.

The present inventors performed a test on the thermal development of an original printing plate having a metal support and found that there was a certain distance from the advancing end of the light-sensitive material beyond which a difference occurred in the image produced.

Figure 3:
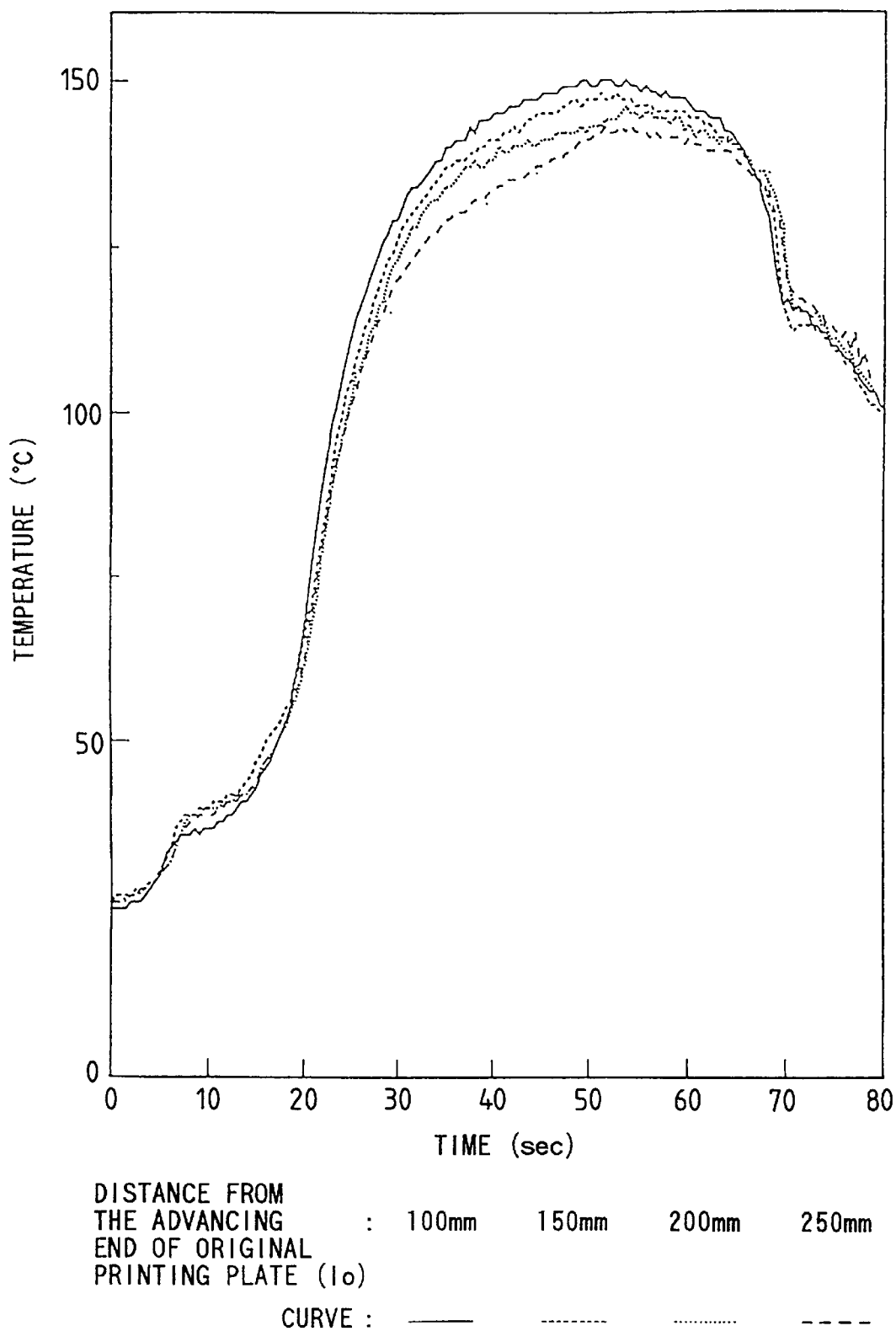
FIG. 3 is a graph showing the variations in temperature profile that occur to a support depending upon the length of a pressure contact zone.

In the test, an original printing plate that used as a support an aluminum plate measuring 0.24 mm in thickness, 800 mm in overall width and 800 mm in overall length and which was coated with a light-sensitive material of a silver triggered polymerization type was subjected to thermal development at a transport speed of 7.5 mm/sec and a temperature of 150° C. and, in addition, temperature measurements were conducted on the center line of the printing plate in the direction of its width at four points that were 100 mm, 150 mm, 200 mm and 250 mm distant from the advancing end of the plate. The results of the measurements are shown in FIG. 3; the horizontal axis of the graph in FIG. 3 plots the time which passed since each point of temperature measurement on the printing plate entered the thermal developing section and the vertical axis plots the temperature at the point of measurement corresponding to each time of passage. Therefore, the horizontal axis of the graph in FIG. 3 represents the position within the thermal developing section and the points at which the individual curves cross the vertical line extending from a certain time on the horizontal axis represent the fluctuations in the ultimate temperature attained when the respective points of measurement were transported to the same position within the thermal developing section.

The results of the measurements revealed that the longer the distance from the advancing end of the original printing plate, the smaller the degree of temperature elevation and it was also verified that poor image areas were accordingly formed in the central portion of the thermally developed printing plate.

In view of these results of measurements, the present inventors noted the thermal expansion of the original printing plate that would occur in the pressure contact zone P and made further verifications based on the following tests assuming that the length lo of the pressure contact zone P would produce the same effect as that of the distance from the advancing end of the original printing plate.

Test 1

An original printing plate that used as a support an aluminum plate measuring 0.24 mm in thickness, 500 mm in overall width and 500 mm in overall length and which was coated with a light-sensitive material of a silver triggered polymerization type was subjected to thermal development at a transport speed of 7.5 mm/sec and a temperature of 135° C. using a plate heater which was so adapted that the pressure contact zone P would have a length lo of 265 mm. In addition, temperature measurements were conducted at seven points that were distant from the left end of the support by the following values: 10 mm, 90 mm, 170 mm, 250 mm (the center of the support in the direction of width), 330 mm, 410 mm and 490 mm.

Figure 4:
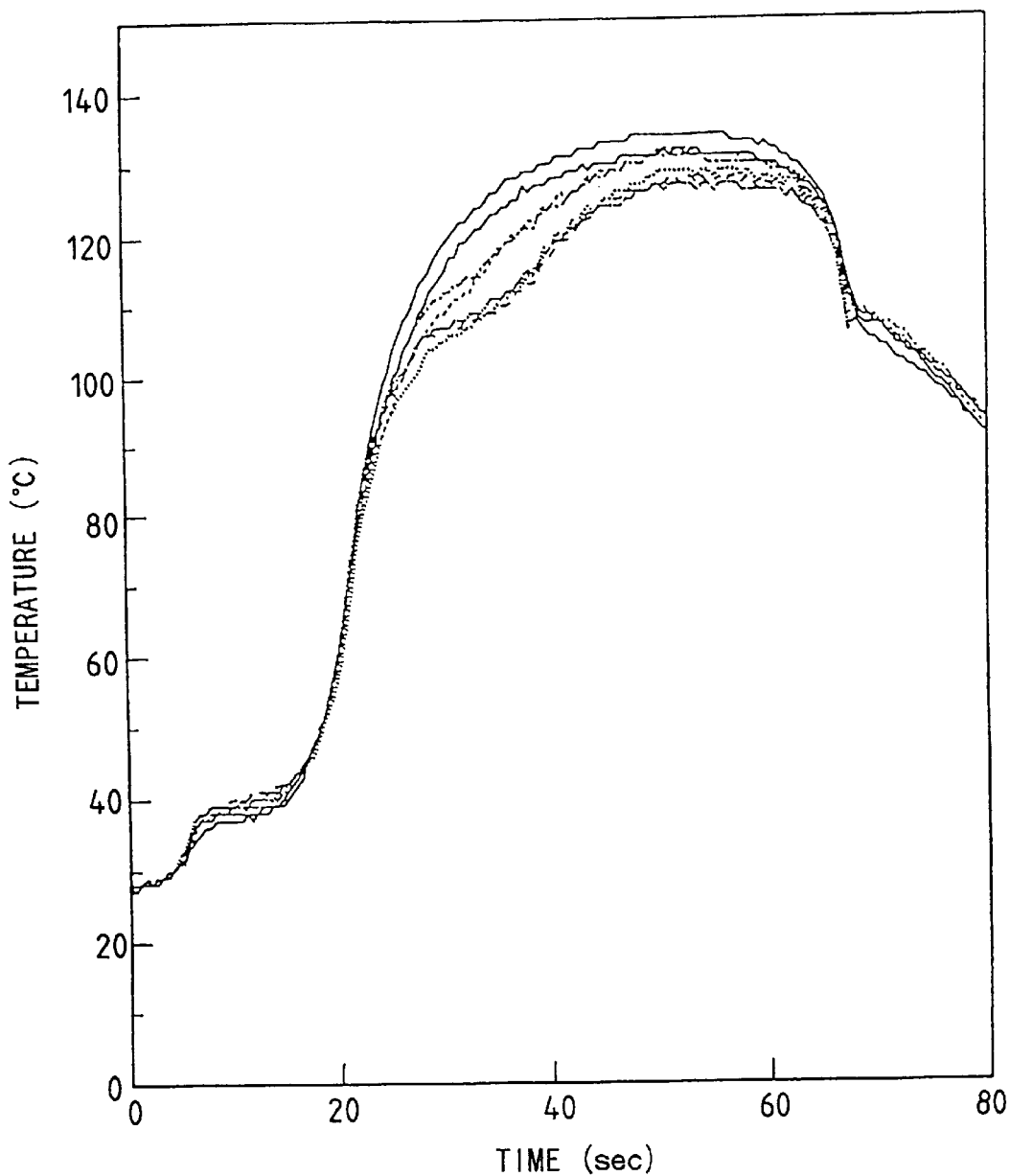
FIG. 4 is a graph showing the variations in temperature that occurred to a support in Test 1.

FIG. 4 shows the variations in temperature that occurred at the respective points of measurement and the points at which the individual curves cross the vertical line extending from a certain time on the horizontal axis represent the temperature profile in the direction of width of the support. One can see from FIG. 4 that in the pressure contact zone P, the support experienced temperature fluctuations in the direction of its width.

In addition, it was verified that poor image areas were formed in the central portion of the thermally developed printing plate.

Test 2

Thermal development was performed under the same conditions as in Test 1, except that the length lo of the pressure contact zone P was reduced to 200 mm. In addition, temperature measurements were conducted at selected points of the support (which were the same as in Test 1). The temperature variations that occurred at the respective points of measurements are shown in FIG. 5.

Figure 5:
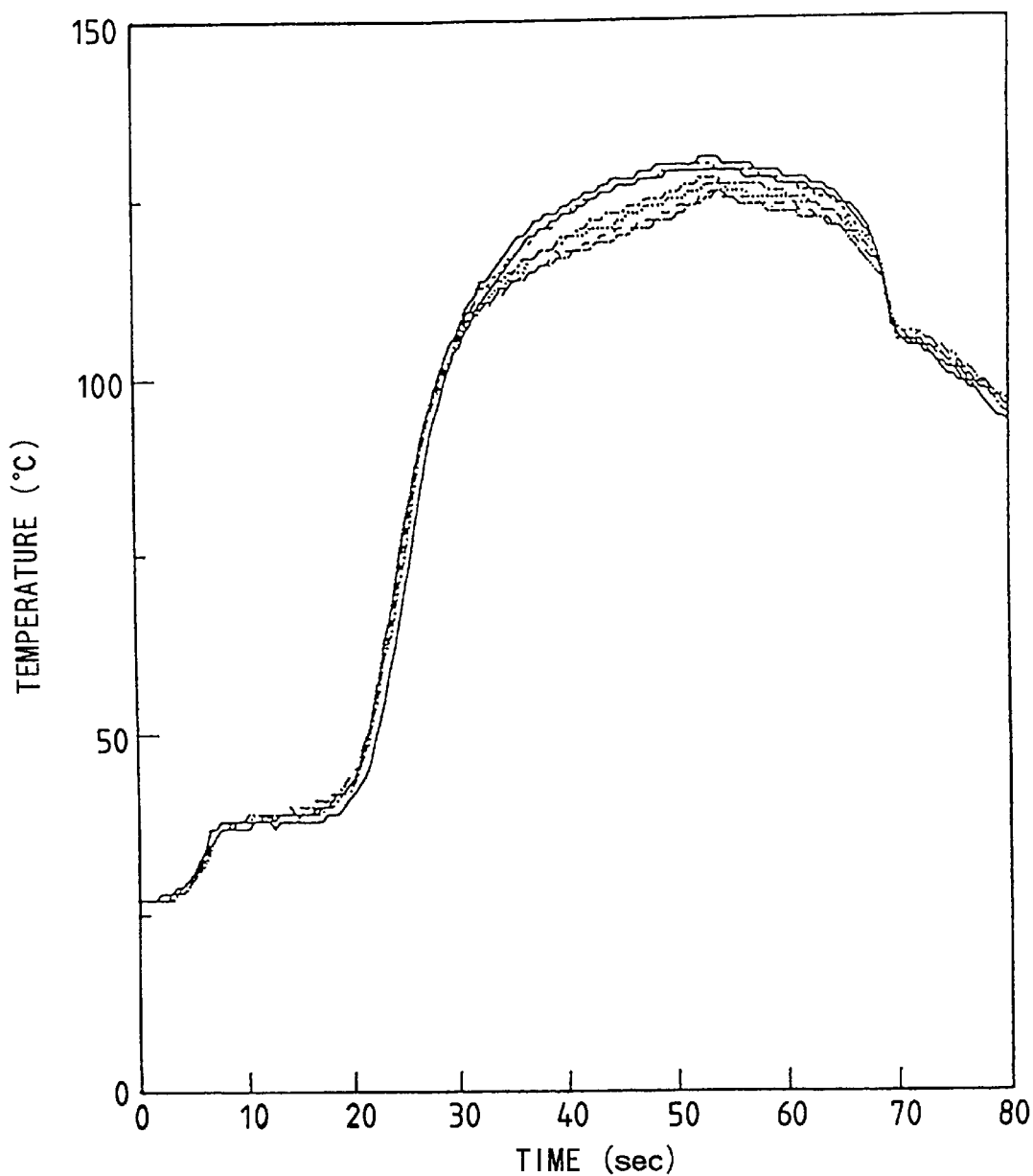
FIG. 5 is a graph showing the variations in temperature that occurred to a support in Test 2.

A comparison between FIGS. 4 and 5 reveals that as the length lo of the pressure contact zone P decreased, the temperature fluctuations became smaller in the direction of width of the support in the pressure contact zone P. In addition, the thermal development caused images to be formed on the entire surface of the printing plate in such a way that there would be no practical problems.

Test 3

An original printing plate that used as a support an aluminum plate measuring 0.24 mm in thickness, 800 mm in overall width and 500 mm in overall length was subjected to thermal development at a transport speed of 2.5 mm/sec and a temperature of 150° C. using a plate heater which was adapted to be such that the pressure contact zone P would have a length lo of 130 mm.

Figure 6:
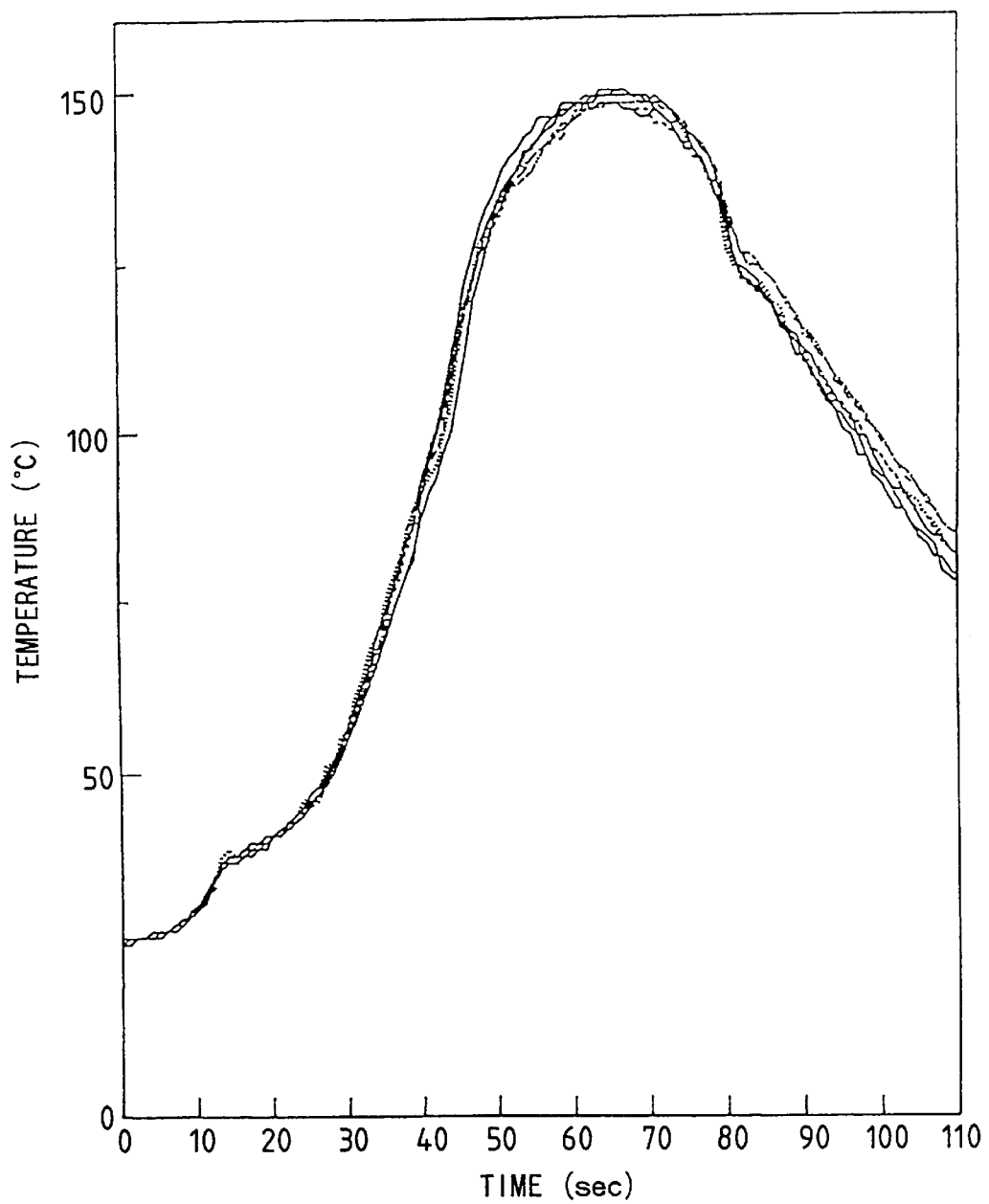
FIG. 6 is a graph showing the variations in temperature that occurred to a support in Test 3.

In addition, temperature measurements were conducted at eight points that were distant from the left end of the support by 50 mm, 150 mm, 250 mm, 350 mm, 450 mm, 550 mm, 650 mm and 750 mm. FIG. 6 shows the temperature variations that occurred at the respective points of measurements.

Since the length lo of the pressure contact zone P was further reduced, the support in the pressure contact zone P was substantially free from temperature fluctuations in the direction of width. In addition, the image produced by the thermal development was uniform over the entire surface of the printing plate.

These test results revealed that given the same thickness of the support, the temperature fluctuations occurring in the direction of width of the support had a tendency to decrease with the length lo of the pressure contact zone P, causing a corresponding decrease in the poor image areas in the central portion of the thermally developed printing plate 10.

Another feature of the present invention is that the length lo of the pressure contact zone P that enables the formation of satisfactory images can be specified in accordance with the thickness of the support of the original printing plate 10. Referring back to the tests just described above, given a support thickness of 0.24 mm, the borderline of the length lo that enables the formation of satisfactory images is approximately 200 mm, and this means that if an original printing plate having an aluminum support with a thickness of 0.24 mm is to be developed thermally, uniform images can be formed by setting up the heating apparatus 1 such that the length lo of the pressure contact zone P is 200 mm.

In addition, great benefits to system design can be obtained if the length lo of the pressure contact zone P in the heating apparatus that enables the formation of uniform images can be determined in accordance with the specific type of the support of the original printing plate 10 and its thickness. In this regard, the present inventors performed additional tests on thermal development at varying thicknesses of the support. As a result, it was found that the allowable thermal expansion would depend on a material's thickness, substantially varying in inverse proportion to the latter. On the basis of this finding, the present inventors derived the following relations.

If the thickness of the support is written as D in millimeters and if the amount of thermal expansion that occurs to the support in the pressure contact zone P in the direction of travel A is written as dl in millimeters, dl<0.13/D for the case where 200 mm was the borderline of the length lo of the pressure contact zone P that ensured the formation of satisfactory images (Test 2) and dl<0.10/D in Test 3 where the length lo of the pressure contact zone P was 130 mm. Stated briefly, the amount of thermal expansion dl preferably satisfies the relation dl<0.13/D, more preferably, dl<0.10/D.

The amount of thermal expansion dl equals to the thermal expansion coefficient of a material of interest multiplied by the change in temperature and the length of the material; if the temperature elevation in the pressure contact zone P, the thermal expansion coefficient of the metal support and the length of the material are written as dT, $\alpha$ and 1, respectively, dl is expressed by $\alpha \cdot dT \cdot 1$.

By assuming that the length lo of the pressure contact zone P corresponds to the material's length 1 in the case of thermal development, the following relation (1) was derived:

$$lo = dl/(\alpha \cdot dT) \quad (1)$$

If the length lo of the pressure contact zone P in the heating apparatus 1 that satisfies the preferred range of thermal expansion dl (dl<0.13/D) is set on the basis of the relation (1), the elongation of the support due to thermal expansion is effectively absorbed to eliminate the possibility of deformation in the original printing plate 10 and, as a result, uniform images can be produced over the entire surface of the printing plate 10 by thermal development.

In the present invention, a preheater may be provided as an additional element of the heating apparatus 1 between the transport roller pair 21 (see FIG. 1) and the pressure contact zone P. This contributes to more efficient thermal development.

Figure 7:
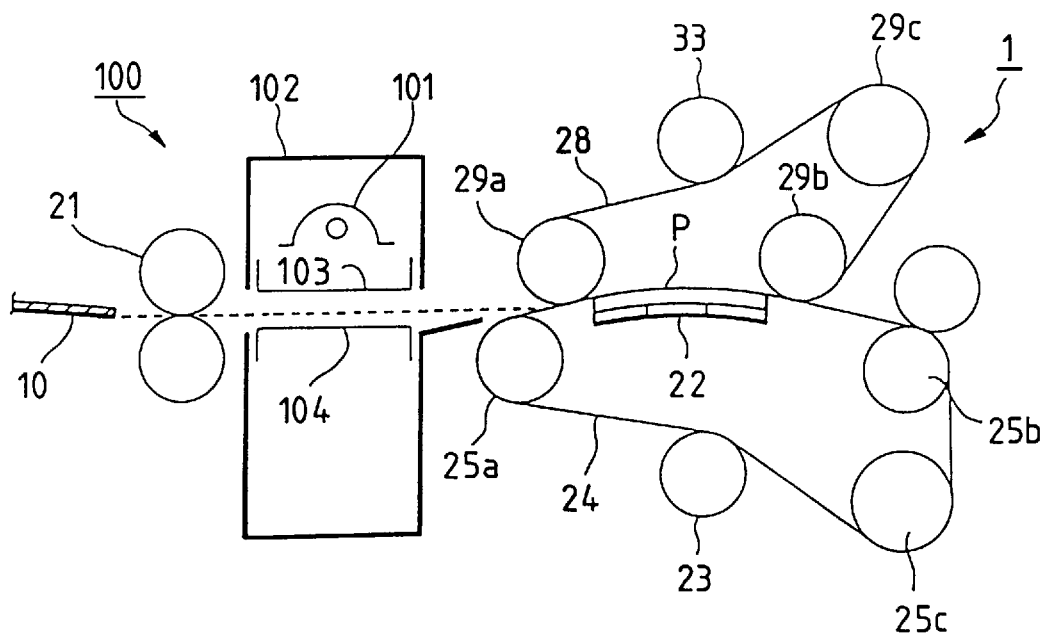
FIG. 7 is a schematic cross section of a design in which the heating apparatus of the invention is fitted with a preheater.

FIG. 7 is a cross section showing the essential part of an example of the heating apparatus 1 which includes a preheater as an additional element. The preheater generally indicated by 100 comprises a radiation heater 101 that is typically in the form of a halogen lamp or a ceramic heater and which is contained in a heat-insulating vessel 102. The heat-insulating vessel 102 includes a pair of upper and lower guides 103 and 104 which provide part of transport paths of the original printing plate 10 and the radiation heater 101 is positioned above the upper guide 103.

The preheater 100 performs preliminary heating in a non-contact manner by means of the radiation heater 101, so even if one attempts to achieve heating at a desired temperature, the heating operation is affected not only by the temperature of the printing plate 10 which is just before the preliminary heating, namely, at the point of time when the printing plate 10 was transported into the heat-insulating vessel 102 (or the surface temperature of each transport roller 21 if its distance from the vessel 102 is sufficiently short) but also by the environmental temperature. Therefore, it is preferred to control the output of the radiation heater 101 on the basis of the following relation (2):

$$W=A(T-To)+B[(T+To)/2-Te] \qquad (2)$$

where W is the output of the radiation heater, T is the temperature setting, Te is the environmental temperature, To is either the temperature of the original printing plate 10 as it is transported into the preheater 100 or the surface temperature of the transport rollers 21, and A and B are proportionality constants which are determined by the heat capacity of the original printing plate, processing speed, radiation coefficient and other variables.

By controlling the output of the radiation heater 101 on the basis of the equation (2), preliminary heating of the printing plate 10 can be accomplished in a consistent manner.

After being transported into the heat-insulating vessel 101 by means of the transport rollers 21, the original printing plate 10 is heated to a predetermined temperature (e.g. 115° C.) as it passes through the vessel 101 and it is subsequently developed thermally in the pressure contact zone P.

This step of preliminary heating allows the printing plate 10 to be transported through the pressure contact zone P at a faster speed, thereby improving the processing efficiency. These effects of the preliminary heating operation were verified by the following test.

Test 4

A plate heater which was adapted to be such that the length lo of the pressure contact zone P was 130 mm as in Test 3 was fitted with a preheater in the form of an infrared halogen heater (output =0.8 kW) to thereby set up a heating apparatus. Using this heating apparatus, an original printing plate of the same type and dimensions as used in Test 3 (i.e., aluminum plate measuring 0.24 mm in thickness, 800 mm in overall width and 500 mm in overall length was coated with a light-sensitive material of a silver triggered polymerization type) was subjected to thermal development at a transport speed of 5 mm/sec which was twice the value employed in Test 3. The preheater was controlled at a temperature of 115° C. on the basis of the equation (2) and the temperature of the pressure contact zone P was adjusted to be 150° C. as in Test 3.

The temperature profiles the support had in the direction of its width are shown in FIG. 8; peak (1) is associated with the temperature elevation due to the preliminary heating with the preheater whereas peak (2) is related to the temperature elevation achieved in the pressure contact zone P. Obviously, the temperature profile in the direction of width of the support in the pressure contact zone P is no less uniform than what was achieved in Test 3, indicating that thermal development can be performed without any practical problems even if the original printing plate 10 is transported at a higher speed.

It should also be mentioned that although the preheater 100 can adopt any constructions, it is preferable to utilize a far-infrared radiation heater as a preheater in order to prevent a fog of the light-sensitive material from being generated.

In the preheater, a conveying speed can be made higher than the test (4) when the surface temperature of the preheater is kept not less than 115° C. as mentioned above. When the original printing plate is made of an IR (infrared radiation) light-sensitive material having a light-sensitive wavelength in the range of 650 nm–700 nm, the surface temperature of the heating surface of a far-infrared radiation heater utilized as a preliminary heater is set not more than 500° C. in order to prevent a fog caused by the infrared radiation from the heating surface from being generated.

Figure 9:
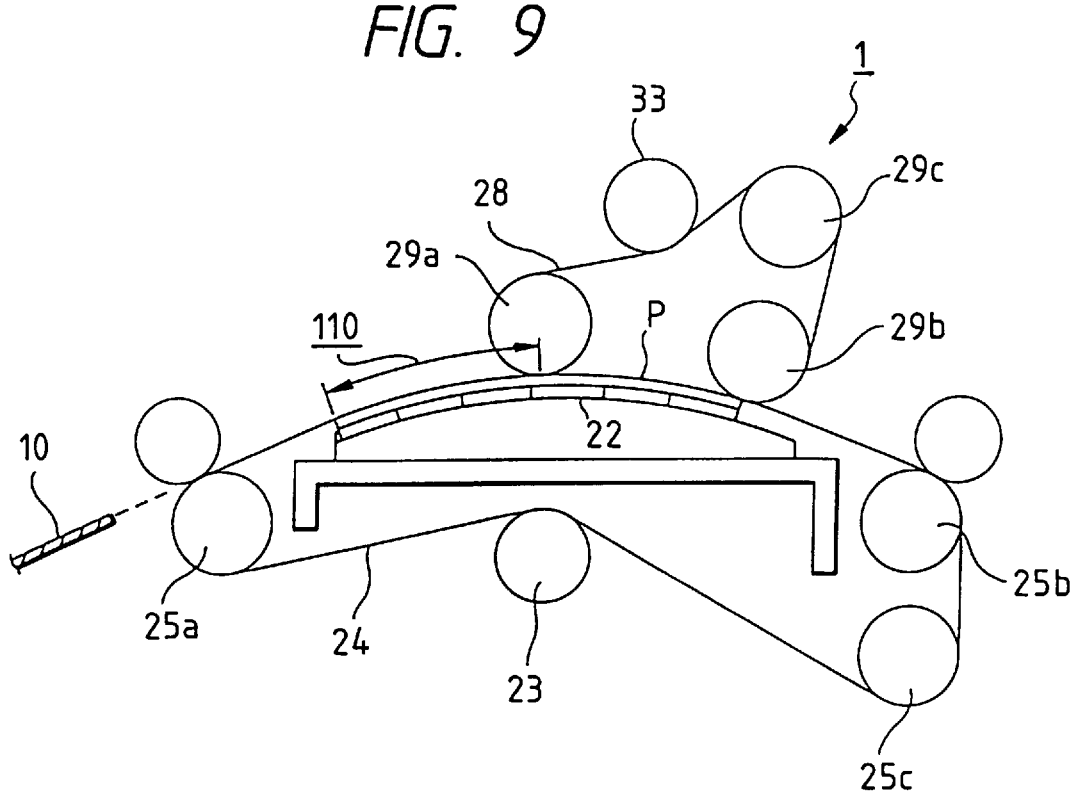
FIG. 9 is a schematic cross section of another design in which the heating apparatus of the invention is fitted with a preheater.
Figure 10:
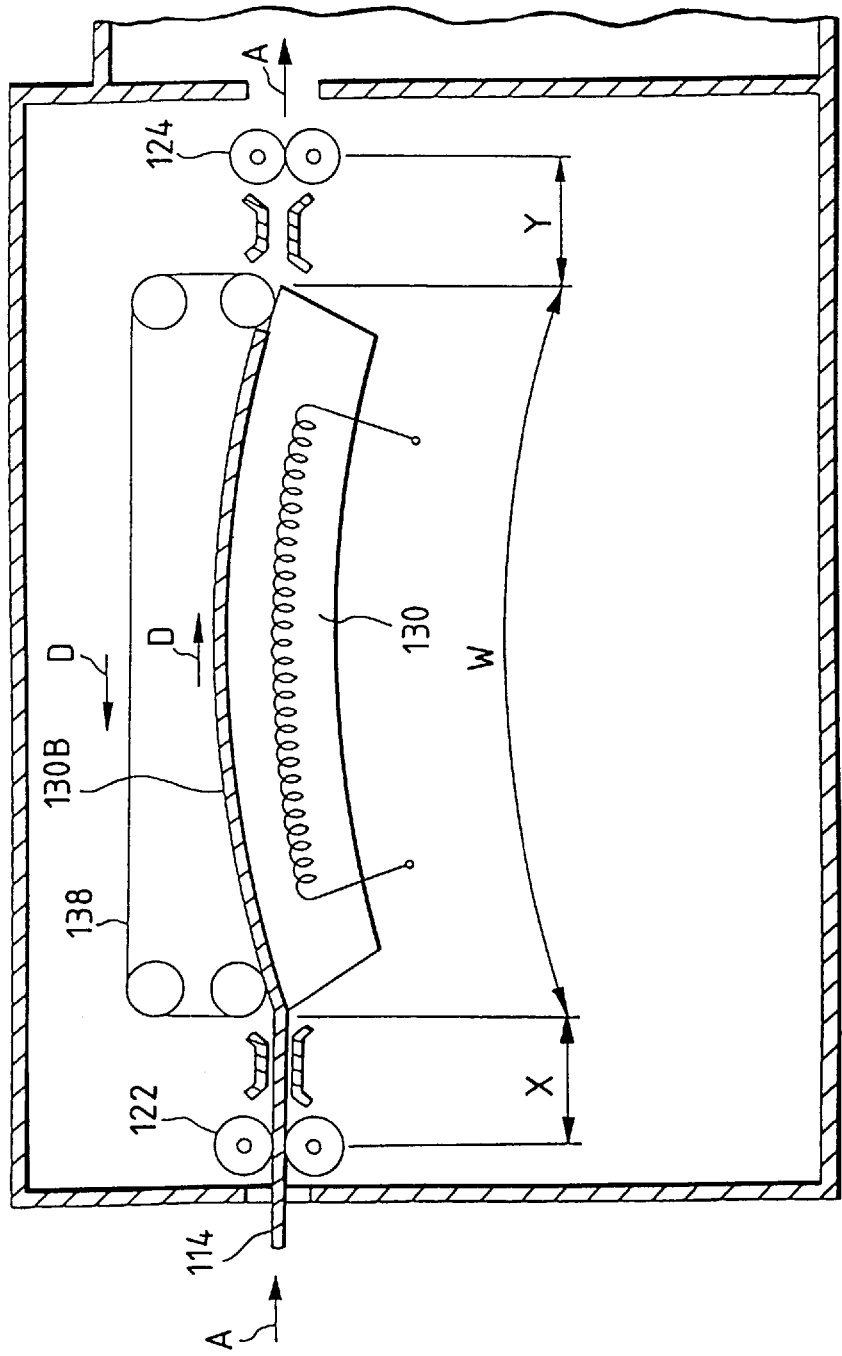
FIG. 10 is a schematic cross section of a prior art heating apparatus.

As already described, the pressure contact zone P is composed of the elements between driven rollers 29a and 29b which in effect are disposed above the plate heater 22. Therefore, as shown in FIG. 9, the upstream driven roller 29a may be disposed on the plate heater 22 in a position halfway the direction of travel A such that the pressure contact zone P is defined by the driven rollers 29a and 29b whereas a pressureless zone 110 situated upstream of the pressure contact zone P is allowed to function as the preheater. Needless to say, even this modification must satisfy the requirement that the length lo of the pressure contact zone P which is defined by the driven rollers 29a and 29b should be specified in the manner described hereinabove.

In the modified design, the plate heater 22 may be set to have a temperature profile such that the pressureless zone 110 is colder than the pressure contact zone P or, alternatively, the plate heater 22 may be set to have the same temperature (i.e., the temperature for development) over the entire surface. Even in the latter case, the temperature of the original printing plate 10 will not rise to the temperature for the development of the light-sensitive material because the plate is heated from the support side and, in addition, the image forming layer is open to the ambient air.

The preheater design just described above contributes to a cutback on the cost of the overall system.

EFFECT OF THE INVENTION

As described on the foregoing pages, according to the present invention, the plate heater in contact with the original printing plate is so adapted that its length in the direction of travel of the printing plate is specified on the basis of the thickness of the metal support; as a result, the elongation of the metal support due to thermal expansion is absorbed in the direction of travel of the original printing plate, thereby allowing the original printing plate to be heat treated under conditions that will not cause any deformation (ridge formation in the central portion) of the plate.

This eliminates the poor contact between the plate heater and the original printing plate to thereby prevent the problems of short press life and uneven development.

What is claimed is:

1. A heating apparatus having a pressure contact zone in which an original printing plate comprising an image forming layer provided on a metal support is brought into pressure contact with a plate heater such that the plate is heated under areal contact, wherein the length of said pressure contact zone in the direction of travel is set by calculation from the following relation (1):

$$lo=dl/(\alpha \cdot dT) \qquad (1)$$

where lo: the length of the pressure contact zone in the direction of travel dT: an incremental temperature elevation α: the coefficient of thermal expansion of the metal support dl: the thermal expansion in millimeters of the metal support in the pressure contact zone in the direction of travel such that dl satisfies dl<0.13/D, where D is the thickness in millimeters of the metal support.

2. A heating apparatus according to claim 1, wherein said original printing plate is brought into pressure contact with said plate heater by applying pressure by means of belts.

3. A heating apparatus according to claim 1 further comprising a preliminary heating means for preliminarily heating said support before said support is heated by said plate heater, in which said original printing plate is made of an (IR) infrared radiation light-sensitive material having a light-sensitive wavelength in the range of 650 nm–700 nm, said preliminary heating means is constituted by a far-infrared heater the heating surface of which has a surface temperature not more than 500° C.

4. A thermal developing system for processing an original printing plate comprising:

an original printing plate which includes a metal support having provided thereon at least one layer containing a silver halide, a reducing agent, a polymerizable compound or a crosslinkable polymer, and a base precursor, in combination with a heating apparatus according to claim 1.

5. A thermal developing system for processing an original printing plate comprising:

an original printing plate which includes a metal support having provided thereon at least one layer containing a silver halide, a reducing agent, a polymerizable compound or a crosslinkable polymer, and a base precursor, in combination with a heating apparatus according to claim 2.

* * * * *